(12) United States Patent
Chen

(10) Patent No.: US 11,342,138 B1
(45) Date of Patent: May 24, 2022

(54) SWITCH DEVICE

(71) Applicant: ZIPPY TECHNOLOGY CORP., New Taipei (TW)

(72) Inventor: Li-Yeh Chen, New Taipei (TW)

(73) Assignee: ZIPPY TECHNOLOGY CORP., New Taipei (TW)

( * ) Notice: Subject to any disclaimer, the term of this patent is extended or adjusted under 35 U.S.C. 154(b) by 0 days.

(21) Appl. No.: 17/242,854

(22) Filed: Apr. 28, 2021

(51) Int. Cl.
*H01H 13/18* (2006.01)
*H01H 3/16* (2006.01)
*H05K 1/02* (2006.01)
*H01H 9/02* (2006.01)

(52) U.S. Cl.
CPC .......... *H01H 13/183* (2013.01); *H01H 3/161* (2013.01); *H01H 9/0271* (2013.01); *H05K 1/0296* (2013.01); *H01H 2205/002* (2013.01)

(58) Field of Classification Search
CPC .... H01H 13/183; H01H 3/161; H01H 9/0271; H05K 1/0296
USPC ................................. 200/61.76, 302.2, 302.3
See application file for complete search history.

(56) References Cited

U.S. PATENT DOCUMENTS

2020/0258697 A1\* 8/2020 Umezu ................ H01C 13/02

FOREIGN PATENT DOCUMENTS

| CN | 204167164 U | 2/2015 |
| CN | 105489429 A | 4/2016 |

\* cited by examiner

*Primary Examiner* — Edwin A. Leon
*Assistant Examiner* — Iman Malakooti
(74) *Attorney, Agent, or Firm* — Muncy, Geissler, Olds & Lowe, PC

(57) ABSTRACT

The invention provides a switch device including a shell, an operating member, a spring, a movable conductor, a first pin, a second pin, two resistors, and two connecting conductors. The operating member is partially exposed out of the shell, and the movable conductor is displaced when the operating member is operated. One side of the shell is provided with the first pin and the spring, another side is provided with the second pin. The resistors are connected with the second pin and have different resistance values. The connecting conductors are arranged between the two pins. The first pin contacts with the movable conductor. The connecting conductors without disposal of any crossover part therebetween and respectively connected with the resistors. The connecting conductors are arranged at intervals along a displacement path of the movable conductor which contacted one connecting conductor before and after displacement and forming two conductive paths.

14 Claims, 5 Drawing Sheets

SWITCH DEVICE

FIELD OF THE INVENTION

The invention relates to a switch device, and more particularly to a switch device for differentiating signals by virtue of resistance difference of two conductive paths.

BACKGROUND OF THE INVENTION

The development of technology in the field of vehicles has witnessed an increasing requirement of control accuracy and safety performance of vehicles, hence an on-board switch has become a focus. In the prior art, a resistor is additionally connected outside a conventional switch device to improve the signal identification, however, it is difficult to spare room for the resistor in a limited space inside a vehicle, which would cause inconvenience in installation. Besides, the conventional resistor is exposed outside the switch device, a manufacturer needs to additionally add a circuit board for installing the resistor; moreover, other parts have to be designed and added to protect the resistor and thus ensure the operation stability of the resistor.

To solve the problems, switch devices are now, in most cases, provided with resistors inside, and supports for fixing the resistor inside the switch device are provided by manufacturers to prevent the resistors from falling off and to improve stability of engagement. However, a conventional support is made of a plastic material and can be rapidly formed through plastic injection, but in this case, an additional step of installing the resistor is inevitable after the formation, even though surface mount resistors are available to facilitate this step, as a result, the process cannot be shortened.

Furthermore, most conventional switch devices do not have a waterproof function, and electronic components inside the switch device face a risk of contacting liquid vapor or liquid. In the long run, if the liquid vapor enters the interior of the switch device, the switching sensitivity of the switch device decreases due to corrosion of the electronic components. Besides, the switch device is extremely small, the electronic components in the switch device are arranged compactly, and if liquid enters the switch device, the adjacent electronic components are electrically communicated through the liquid, leading to wrong outputs of the switch device. Therefore, if the switch device has waterproof capability, the service life of the electronic device can be greatly prolonged.

Furthermore, the Chinese patents No. CN 105489429 A and CN 204167164 U disclose a resistor disposed inside a switch device. Specifically, two resistors of the switch device are connected with conductors inside the device, the switch device determines a conductive loop according to positions of conductive strips and sets signals apart by the resistance values of the resistors in the conductive loop. However, the two resistors in the conventional switch device are connected in series in one loop, once one of the two resistors fails, then the loop cannot output a signal with a corresponding resistance value, which ends up the same as in the case without the two resistors in the loop when turned on, that is to say, the conventional switch cannot differentiate the signals, and cannot provide control.

SUMMARY OF THE INVENTION

It is a major object of the invention to solve the problem that happens when a conventional switch device fails to differentiate signals.

To achieve the above object, the invention provides a switch device comprising a shell; an operating member partially exposed out of the shell to be operated; a spring pushing the operating member; a movable conductor displaced when the operating member is operated; a first pin disposed on a side of the shell where is same as the spring disposed, wherein the first pin contacts the movable conductor no matter the movable conductor is displaced or not; a second pin, wherein the second pin and the first pin are disposed on two sides of the shell, respectively; two resistors disposed in the shell and connected with the second pin, the two resistors having different resistance values; and two connecting conductors disposed in the shell and positioned between the first pin and the second pin, the two connecting conductors without disposal of any crossover part therebetween, each of the two connecting conductors connected with one of the two resistors, and the two connecting conductors disposed at intervals along a displacement path of the movable conductor which is contacted with one of the two connecting conductors before and after displacement to form two conductive paths.

In an embodiment, the two resistors are not disposed within a projection range of the movable conductor.

In an embodiment, the two resistors are parallel and spaced up and down.

In an embodiment, each of the two resistors is a surface mount resistor.

In an embodiment, the shell comprises a base and a cover matched up with the base, and the first pin and the second pin penetrate through the base to be partially exposed out of the shell.

In an embodiment, the two connecting conductors are spaced up and down, and one of the two connecting conductors which is nearer the base is fixed on the base.

In an embodiment, the base is formed with a support wall that supports at least one of the two connecting conductors and the second pin.

In an embodiment, the support wall defines a hollowed portion where the two resistors are disposed.

In an embodiment, the support wall is formed with a separating rib that separates the movable conductor from the two resistors, and a separating block between the two connecting conductors.

In an embodiment, the base is formed with a protrusion that positions the spring.

In an embodiment, the first pin comprises a connecting section extending out of the shell, a knuckling section integrally extending from the connecting section and embedded in the base, and an acting section integrally extending from the knuckling section and contacting the movable conductor, the connecting section and the acting section is not coaxial.

In an embodiment, the connecting section of the first pin, the spring, and the operating member are located on an axis.

In an embodiment, the switch device comprises a movable block in the shell, the movable block provides for the operating member to be disposed and is formed with a fitting groove against which one end of the spring abuts and a fitting opening providing for the movable conductor to be disposed.

Accordingly, the invention is more advantageous than the prior art in that: either of the two resistors is provided on either of the two conductive paths, and the two resistors have different resistance values. The switch device differentiate signals specifically through the difference in the resistance values of the two resistors. Also, when one of the two conductive paths cannot be turned on, the switch device can still differentiate signals through the difference in resistance values on the two conductive paths.

DETAILED DESCRIPTION OF THE PREFERRED EMBODIMENTS

Figure 1:
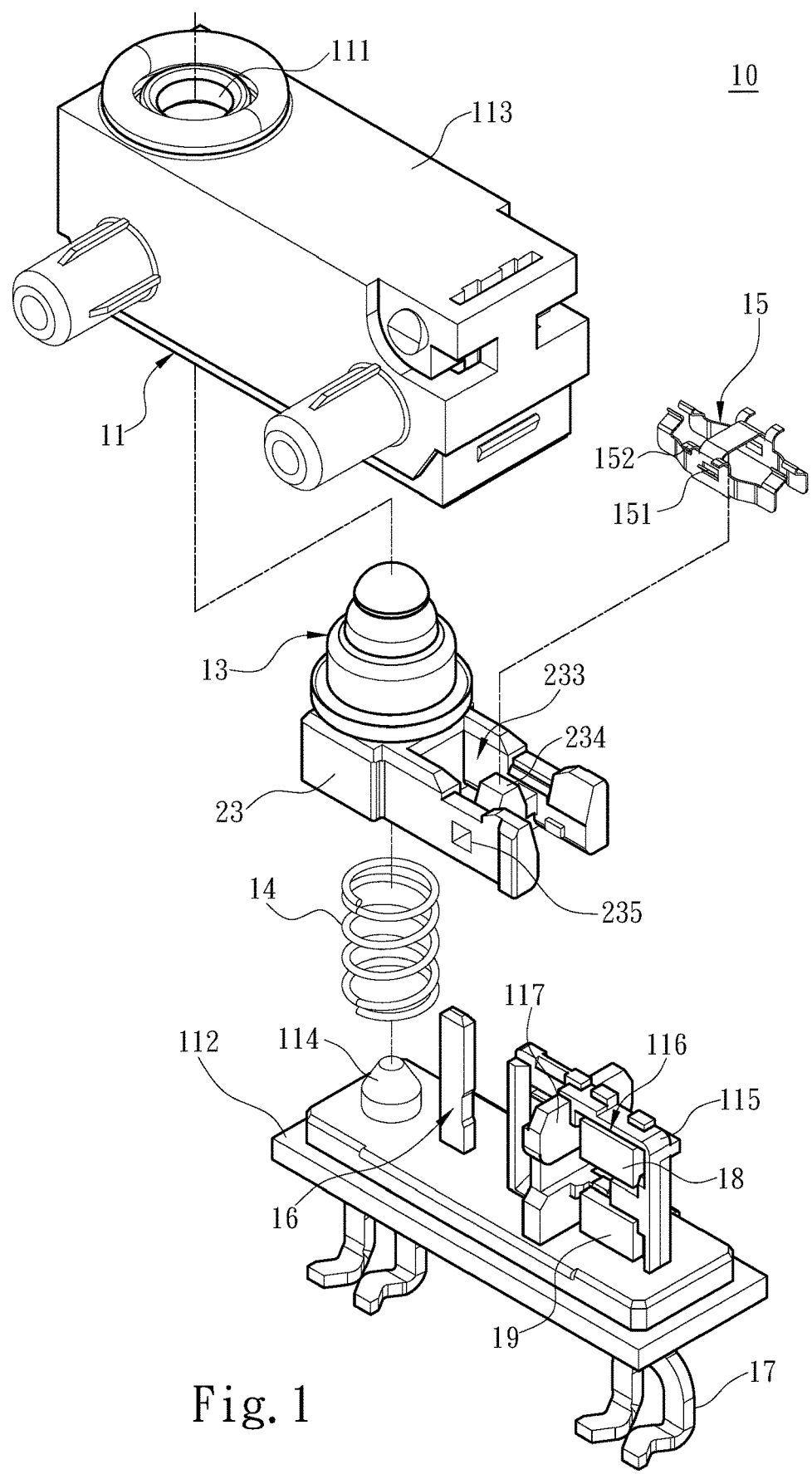
FIG. 1 is a structural exploded view of an embodiment of the invention.

The detailed description and technical solutions of the invention will now be set forth with reference to the drawings as follows.

Referring to FIG. 1, FIG. 2, FIG. 3 and FIG. 4, this invention provides a switch device 10 including a shell 11, an operating member 13, a spring 14, a movable conductor 15, a first pin 16, a second pin 17, two resistors 18, 19, and two connecting conductors 21, 22. Specifically, the shell 11 is formed of an insulating material to provide the first pin 16 and the second pin 17 for engagement, and the shell 11 accommodates and protects the two resistors 18, 19 and the two connecting conductors 21, 22. In an embodiment, the shell 11 is formed with an assembling port 111 to match up with the operating member 13 which is engaged at the assembling port 111 and partially exposed outside the shell 11 for operation. The operating member 13 is displaced towards a side wall of the shell 11 upon operating. The spring 14 is arranged to face the operating member 13, one end of the spring 14 is supported on an inner wall at a bottom of the shell 11, the other end of the spring 14 abuts against the operating member 13, the spring 14 exerts a force to push the operating member 13 towards the assembling port 111, the spring 14 is compressed when the operating member 13 is operated, and the spring 14 restores the operating member 13 to an original state through the accumulated force when the operating member 13 is released from the compression. The movable conductor 15 is made of an electrically conductive material to engage with the operating member 13, and the movable conductor 15 is displaced towards the side wall of the shell 11 when the operating member 13 is operated.

Referring to FIG. 1, FIG. 2, FIG. 3 and FIG. 4, the first pin 16 is disposed on a side of the shell 11 where is same as the spring 14 disposed, and one end of the first pin 16 is not shielded by the shell 11 but exposed outside the shell 11 to be used for engaging at least one external device (not shown), the other end of the first pin 16 is disposed in the shell 11 to contacts the movable conductor 15 continuously no matter the movable conductor 15 is displaced or not. The first pin 16 provides the movable conductor 15 for sliding thereon when the movable conductor 15 is driven to be displaced by the operating member 13, and the first pin 16 is a COM pin known to a person skilled in the art. The second pin 17 is provided on a side of the shell 11 without disposal of the first pin 16, the second pin 17 and the first pin 16 are positioned at two sides of the shell 11 which are opposite to each other, and a part of the second pin 17 is exposed outside the shell 11 and the other part of the second pin 17 is shielded by the shell 11. The two resistors 18, 19 are connected with the other part of the second pin 17 within the shell 11. In an embodiment, the two resistors 18, 19 are surface mounting resistors, and the two resistors 18, 19 are each assembled with the second pin 17 in a surface mounting manner. The two resistors 18, 19 are not connected with each other. The switch device 10 obtains resistance values of the first pin 16 and the second pin 17 after the two resistors 18, 19 are conducted. Further, in this embodiment, resistance values of the two resistors 18, 19 are set to be different, that is, different resistance values of the first pin 16 and the second pin 17 may be measured when the two resistors 18, 19 respectively conducted, so that increasing signal recognition of the switch device 10. The two connecting conductors 21, 22 are respectively positioned on a side of the two resistors 18, 19 without connecting with the second pin 17, and each of the two connecting conductors 21, 22 connects one of the two resistors 18, 19. The two connecting conductors 21, 22 are positioned between the first pin 16 and the second pin 17 after each of the two connecting conductors 21 engaging with one of the two resistors 18, 19. The two connecting conductors 21, 22 respectively form a conductive relationship with the movable conductor 15 during displacement of the movable conductor 15, so that the two connecting conductors 21, 22 conduct with the first pin 16 and the second pin 17. Further, the two connecting conductors 21, 22 are disposed at intervals along a displacement path of the movable conductor 15. The movable conductor 15 is only conducted with one of the two connecting conductors 21, 22 before and after displacement to form two conductive paths since the two connecting conductors 21, 22 is without disposal of any crossover part therebetween.

Figure 5:
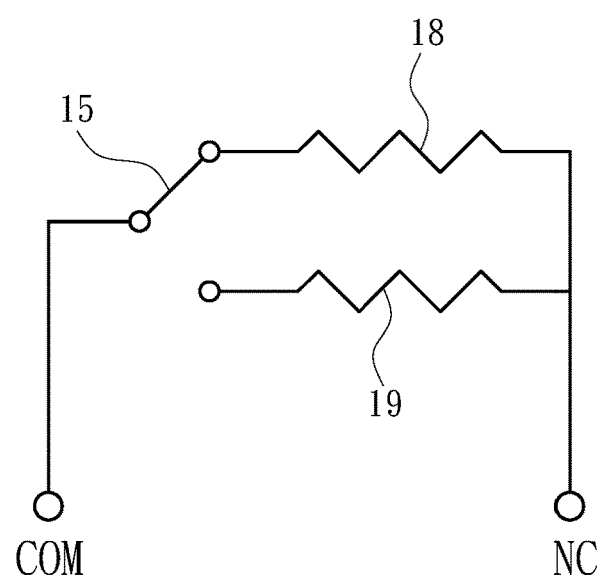
FIG. 5 is a first circuit diagram of an embodiment of the invention.
Figure 6:
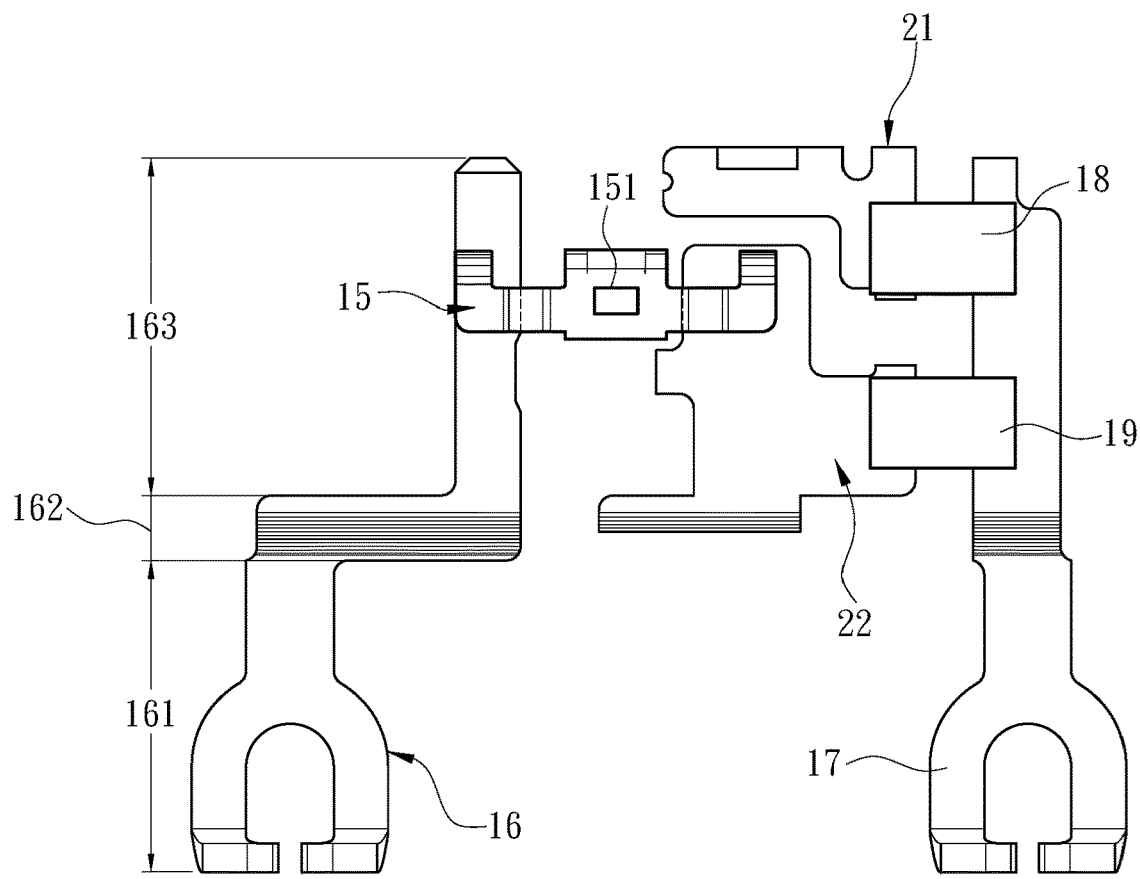
FIG. 6 is a second schematic diagram of an implementation of an embodiment of the invention.
Figure 7:
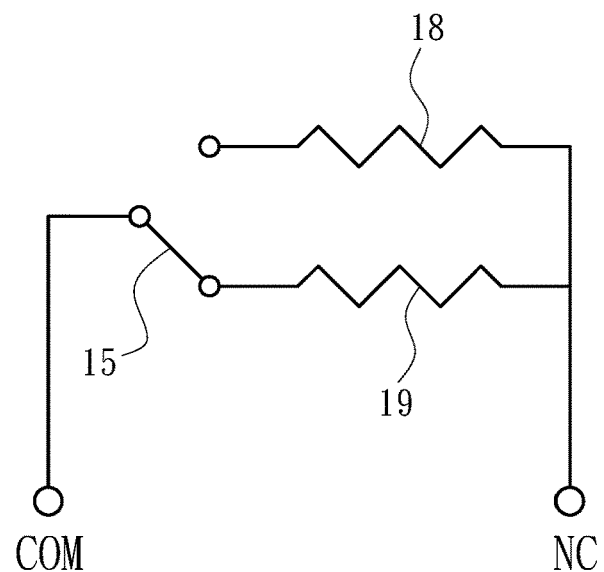
FIG. 7 is a second circuit diagram of an embodiment of the invention.

Accordingly, to explain the two conductive paths in detail hereinafter, the two resistors 18, 19 are distinguished as a first resistor 18 and a second resistor 19, and the two connecting conductors 21, 22 are distinguished as a first connecting conductor 21 and a second connecting conductor 22, wherein the first connecting conductor 21 is connected with the first resistor 18 and the second connecting conductor 22 is connected with the second resistor 19. The two conductive paths are distinguished as a first conductive path and a second conductive path, wherein the first conductive path is provided for conducting the first resistor 18 and the first connecting conductor 21, and the second conductive path is provided for conducting the second resistor 19 and the second connecting conductor 22. Moreover, assuming that the operating member 13 is not operated initially, one end of the movable conductor 15 is not acted upon by the operating member 13 to contact the first connecting conductor 21. The operating member 13 is operated to compress the spring 14 and drive the other end of the movable conductor 15 to be reversely slid on the first pin 16, and one end of the movable conductor 15 switches to contact with the second connecting conductor 22 from the first connecting conductor 21. At this moment, the first pin 16 conducts with the second connecting conductor 22, the second resistor 19, and the second pin 17 through the movable conductor 15. In other words, the movable conductor 15 is conducted by the second conductive path when the operating member 13 is operated, and the switch device 10 generates a resistance value corresponding to the second conductive path such as in FIGS. 6 and 7. Once the operating member 13 is released from an operation state, the spring 14 is no longer compressed by the operating member 13, an elastic action of the spring 14 is released to push the operating member 13 to be displaced towards a direction facing the assembling port 111, the other end of the movable conductor 15 is driven by the operating member 13 to be reversely slid on the first pin 16, and one end of the movable conductor 15 switches to contact with the first connecting conductor 21 from the second connecting conductor 22. At this time, the first pin 16 conducts with the first connecting conductor 21, the first resistor 18, and the second pin 17 through the movable conductor 15. In other words, the movable conductor 15 no longer conducts with the second conductive path but conducts with the first conductive path when the operating member 13 is released from the operation state, and the switch device 10 generates a resistance value corresponding to the first conductive path such as in FIGS. 4 and 5.

In one embodiment, the second pin 17 is a NO pin commonly known to the person skilled in the art, and the two resistors 18, 19 are disposed in the shell 11 to be respectively connected with the second pin 17, thereby reducing a space required for assembling the switch device 10. The first resistor 18 and the second resistor 19 do not need additional protection so as to reduce a cost of the switch device 10. To compare the invention with the prior art, the switch device 10 in the invention is able to distinguish signal differences during operation through disposal of different resistance values of the first resistor 18 and the second resistor 19 on the two conductive paths. Furthermore, when one of the two conductive paths cannot be conducted, the switch device 10 is still able to distinguish signal differences by comparing resistance values of the two conductive paths.

Referring to FIG. 1, FIG. 2, FIG. 3 and FIG. 4, in an embodiment, the first connecting conductor 21 is disposed within a projection range of the second connecting conductor 22, and the second connecting conductor 22 is disposed within a projection range of the first connecting conductor 21. Specifically, the first connecting conductor 21 and the second connecting conductor 22 are spaced up and down, and a spacing between the first connecting conductor 21 and the second connecting conductor 22 is not a constant value. In this embodiment, the first connecting conductor 21 is horizontally higher than the second connecting conductor 22, that is, the first connecting conductor 21 contacts the movable conductor 15 when the operating member 13 is not operated, and the second connecting conductor 22 contacts the movable conductor 15 when the movable conductor 15 is driven by the operating member 13 to displace.

Accordingly, the first resistor 18 is located on one side of the first connecting conductor 21 without facing the movable conductor 15, and the second resistor 19 is located on one side of connecting conductor the second connecting conductor 22 without facing the movable conductor 15, both the first resistor 18 and the second resistor 19 are not disposed within the projection range of the movable conductor 15, and a conductive relationship is form between the movable conductor 15 and one of the first resistor 18 and the second resistor 19 through any one of the first connecting conductor 21 and the second connecting conductor 22. Further, the first resistor 18 and the second resistor 19 are parallel and spaced up and down. In this embodiment, the first resistor 18 is connected with the first connecting conductor 21, the second resistor 19 is connected with the second connecting conductor 22, and the first connecting conductor 21 is horizontally higher than the second connecting conductor 22 so that the first resistor 18 is horizontally higher than the second resistor 19. The first resistor 18 is conducted when the movable conductor 15 is not driven by the operating member 13 to displace, the switch device 10 provides the first conductive path, and the second resistor 19 is conducted when operating member 13 compresses the spring 14 to drive the movable conductor 15 to displace, and the switch device 10 provides the second conductive path.

Referring to FIG. 1, FIG. 2, FIG. 3 and FIG. 4, in an embodiment, the shell 11 of the invention comprises a base 112 and a cover 113. Specifically, one side of the base 112 is provided with the first pin 16 for passing through the base 112, and the other side of the base 112 is provided with the second pin 17 for passing through the base 112. Further, one end of the spring 14 without facing the operating member 13 abuts against one side of the base 112 where the first pin 16 is provided. In an embodiment, the base 112 is formed with a protrusion 114 for positioning the spring 14, and the protrusion 114 limits the spring 14 to fall off. Furthermore, the second connecting conductor 22 is fixed on the other side of the base 112 where the second pin 17 is provided. In an embodiment, the second connecting conductor 22 is actually formed with an NC pin known to the person skilled in the art. In detail, the NC pin penetrates through the base 112 to be fixed on the base 112 upon engagement, a part of the NC pin is exposed on one side of the base 112 without facing the cover 113, and then the part of the NC pin exposed outside the base 112 is removed, so that the second connecting conductor 22 is formed by the NC pin located inside the shell 11 connecting conductor. Besides, in an embodiment, the base 112 may be engaged with the cover 113 through laser welding, so that waterproof performance of the base 112 and the cover 113 is improved. In another embodiment, the base 112 and the cover 113 may be bound with a glue (not shown in the figures) to improve waterproof performance of the switch device 10.

Further, the base 112 is provided with a support wall 115 to fix the second pin 17, the first connecting conductor 21, and the second connecting conductor 22. The support wall 115 can be integrally formed on the base 112 without additional process steps. In an embodiment, the support wall 115 is provided with a hollowed portion 116 for disposal of the first resistor 18 and the second resistor 19 therein, and the second pin 17, the first connecting conductor 21, and the second connecting conductor 22 are not completely shielded by the support wall 115 through disposal of the hollowed portion 116, so that the first resistor 18 is able to connect with the second pin 17 and the first connecting conductor 21, and the second resistor 19 is able to connect with the second pin 17 and the second connecting conductor 22. The invention simplifies a manufacturing process of the switch device 10, the switch device 10 can be formed with the hollowed portion 116 through injection molding while the support wall 115 is formed, thereby shortening the manufacturing process and facilitating manufacturing of the switch device 10.

Figure 2:
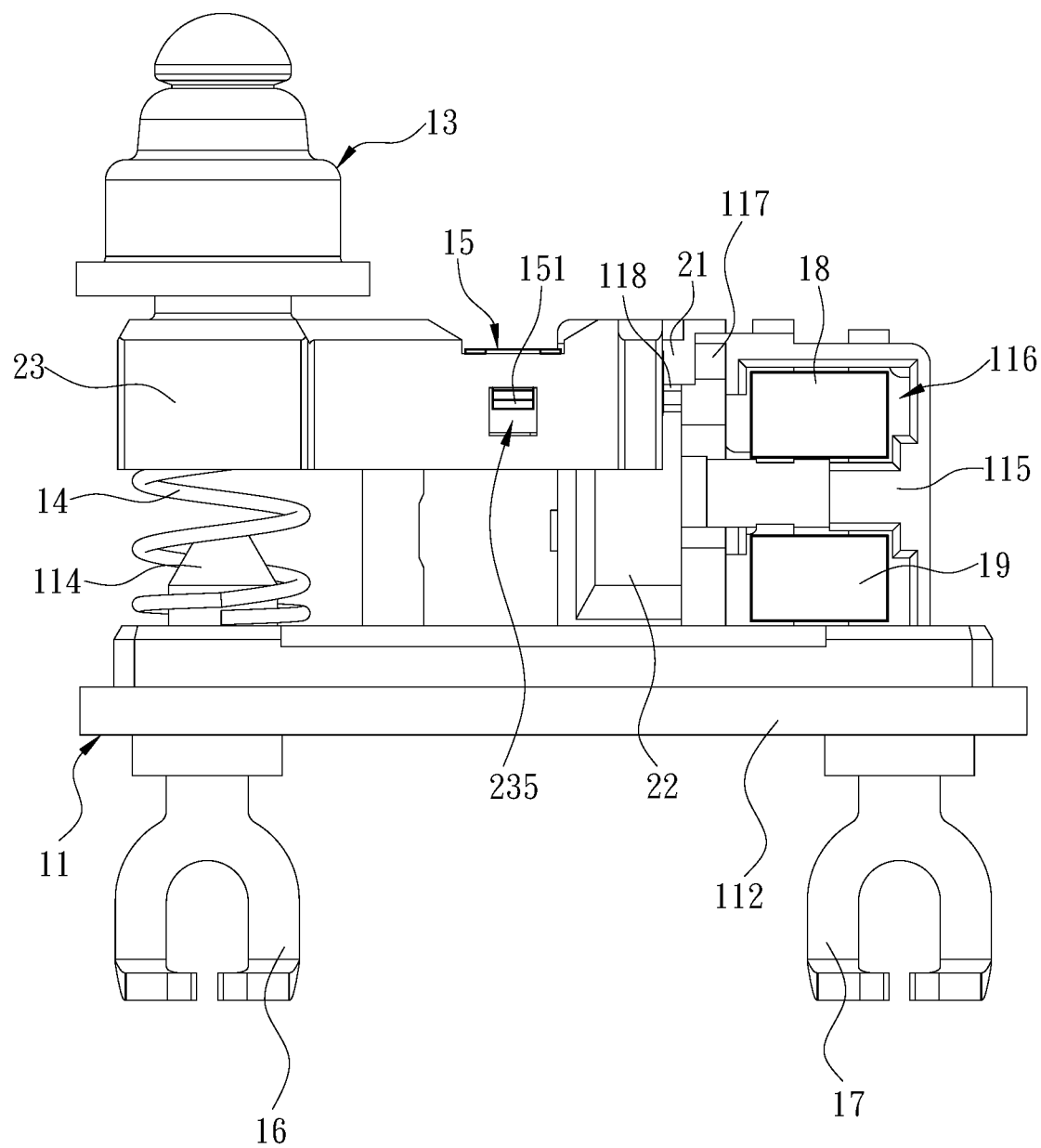
FIG. 2 is a front view of some components of an embodiment of the invention.
Figure 3:
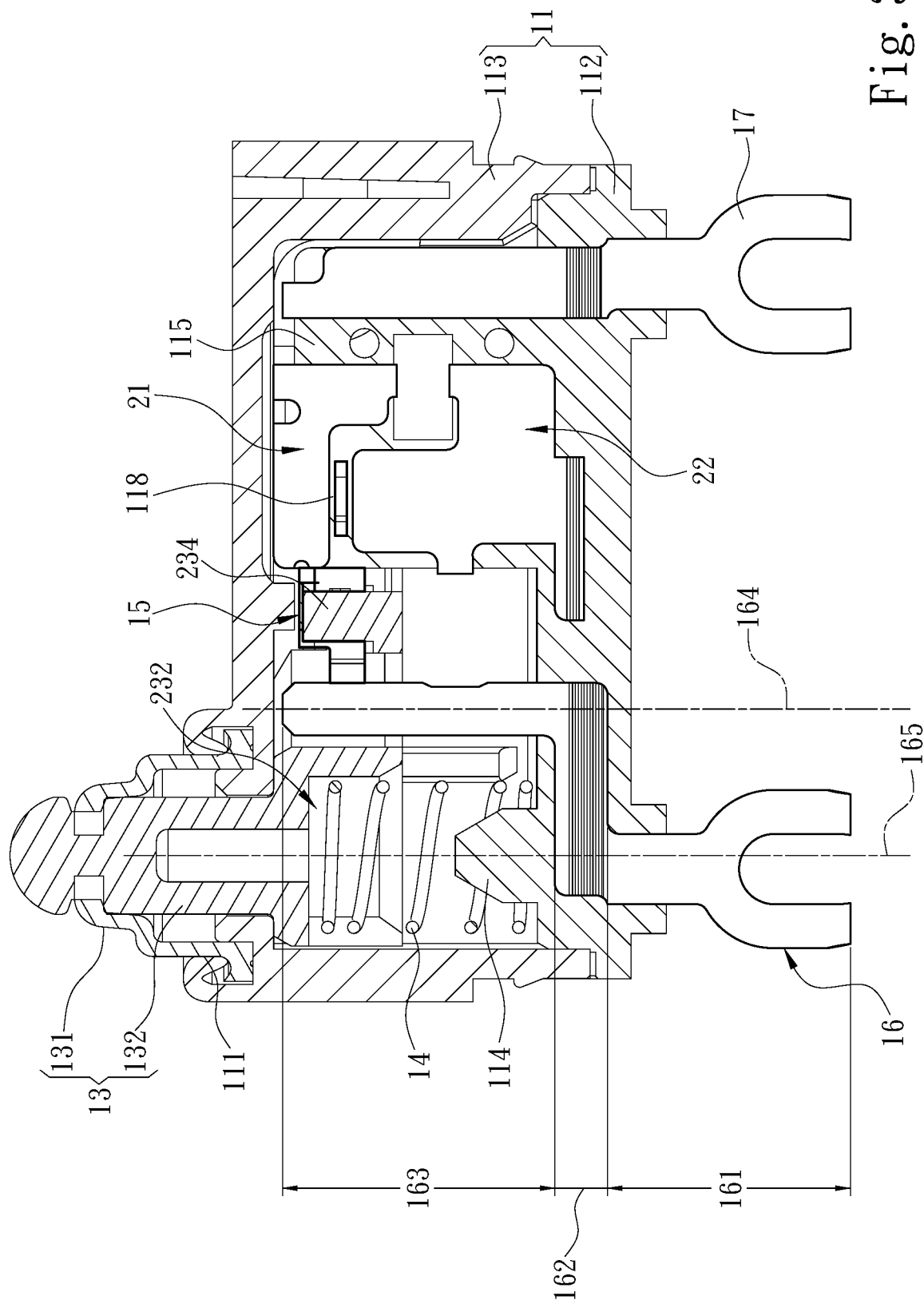
FIG. 3 is a cross-sectional view of an embodiment of the invention.
Figure 4:
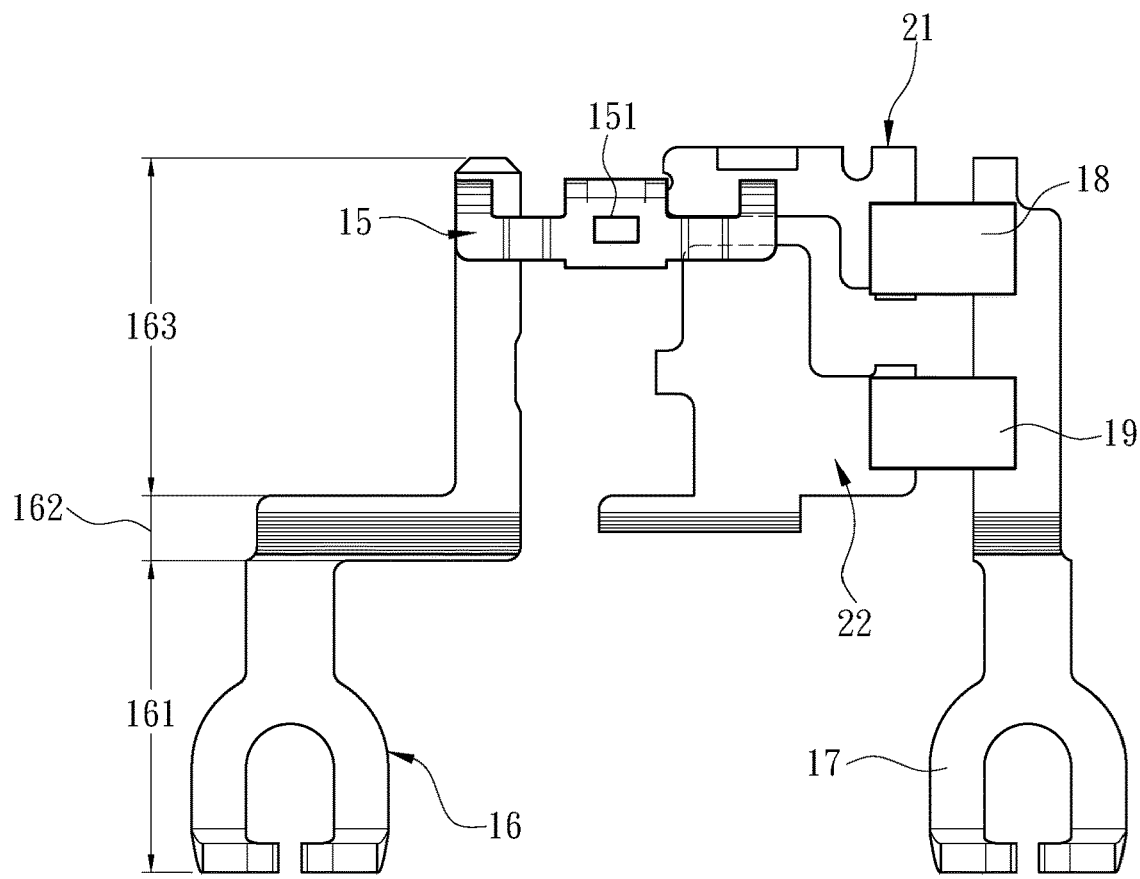
FIG. 4 is a first schematic diagram of an implementation of an embodiment of the invention.

Accordingly, referring to FIG. 1, FIG. 2 and FIG. 3, in an embodiment, the support wall 115 is formed with a separating rib 117 and a separating block 118, wherein the separating rib 117 is used for separating the movable conductor 15 from the first resistor 18 and the second resistor 19 during displacement. Besides, the separating block 118 is positioned between the first connecting conductor 21 and the second connecting conductor 22 for separating the first connecting conductor 21 from the second connecting conductor 22 to avoid direct contact between the first connecting conductor 21 and the second connecting conductor 22.

In an embodiment, the first pin 16 includes a connecting section 161, a knuckling section 162 and an acting section 163, wherein the connecting section 161 is protruded from the shell 11 to contact with at least one external device, the knuckling section 162 extends from the connecting section 161 towards the cover 113 to be embedded in the base 112. In an embodiment, to enhance the stability of engaging the knuckling section 162 with the base 112, the knuckling section 162 is implemented in a wave-like configuration to increase an area of engagement of the knuckling section 162 with the base 112. Further, the acting section 163 extends from the knuckling section 162 towards the cover 113 and is shielded by the cover 113, the acting section 163 is used for connecting the movable conductor 15, and the acting section 163 and the connecting section 161 are parallel and respectively located on two axes 164, 165. Further, the acting section 163 is parallel to the spring 14, so that the spring 14, the connecting section 161 and the operating member 13 are located on the same axis 165.

In an embodiment, the operating member 13 includes a cap 131 and a mounting stick 132 over which the cap 131 is fitted, and the cap 131 is hot riveted on the shell 11 close around the assembling port 111 so that the cap 131 is mounted on the mounting stick 132. Further, the switch device 10 includes a movable block 23 provided in the shell 11, connected with the operating member 13, and positioning the spring 14. Specifically, the movable block 23 is formed with a fitting groove 232 and a fitting opening 233, the fitting groove 232 is provided on a side of the movable block 23 opposite to the operating member 13, the fitting groove 232 faces the spring 14 and cooperates with the spring 14, and the fitting groove 232 restricts the spring 14 and one end of the spring 14 abuts against the fitting groove 232. The fitting opening 233 provides for the movable conductor 15 to be disposed therein so that the movable conductor 15 is moved by the movable block 23 when the operating member 13 is operated. In an embodiment, the movable block 23 is provided with an engaging block 234 in the fitting opening 233, and the engaging block 234 engages the movable conductor 15 to fix the movable conductor 15 on the movable block 23. Further, to stabilize the engagement between the movable conductor 15 and the movable block 23, at least one limiting hole 235 is formed in the movable block 23, the movable conductor 15 is formed with at least one lug 151, the at least one limiting hole 235 is matched up with the at least one lug 151, and the at least one lug 151 is engaged in the at least one limiting hole 235 to improve the stability of the movable conductor 15 in the engagement with the movable block 23. In still another embodiment, the movable conductor 15 is formed with at least one auxiliary engaging arm 152 engaged with the movable block 23, and the at least one auxiliary engaging arm 152 assists in improving the stability of the movable conductor 15 in the engagement with the movable block 23.

What is claimed is:

1. A switch device, comprising:
   a shell;
   an operating member, partially exposed out of the shell to be operated;
   a spring, pushing the operating member;
   a movable conductor, displaced when the operating member is operated;
   a first pin, disposed on a side of the shell where is same as the spring disposed, wherein the first pin contacts the movable conductor no matter the movable conductor is displaced or not;
   a second pin, the second pin and the first pin disposed on two sides of the shell, respectively;
   two resistors, disposed in the shell and connected with the second pin, the two resistors having different resistance values; and
   two connecting conductors, disposed in the shell and positioned between the first pin and the second pin, the two connecting conductors without disposal of any crossover part therebetween, each of the two connecting conductors connected with one of the two resistors, and the two connecting conductors disposed at intervals along a displacement path of the movable conductor which is contacted with one of the two connecting conductors before and after displacement to form two conductive paths.

2. The switch device according to claim 1, wherein the two resistors are not disposed within a projection range of the movable conductor.

3. The switch device according to claim 2, wherein the two resistors are parallel and spaced up and down.

4. The switch device according to claim 1, wherein each of the two resistors is a surface mount resistor.

5. The switch device according to claim 1, wherein the shell comprises a base and a cover matched up with the base, and the first pin and the second pin penetrate through the base to be partially exposed out of the shell.

6. The switch device according to claim 5, wherein the two connecting conductors are spaced up and down, and one of the two connecting conductors which is nearer the base is fixed on the base.

7. The switch device according to claim 6, wherein the base is formed with a support wall that supports at least one of the two connecting conductors and the second pin.

8. The switch device according to claim 7, wherein the support wall defines a hollowed portion where the two resistors are disposed.

9. The switch device according to claim 8, wherein the support wall is formed with a separating rib that separates the movable conductor from the two resistors, and a separating block between the two connecting conductors.

10. The switch device according to claim 5, wherein the base is formed with a protrusion that positions the spring.

11. The switch device according to claim 10, wherein the first pin comprises a connecting section extending out of the shell, a knuckling section integrally extending from the connecting section and embedded in the base, and an acting section integrally extending from the knuckling section and contacting the movable conductor, the connecting section and the acting section is not coaxial.

12. The switch device according to claim 11, wherein the connecting section of the first pin, the spring, and the operating member are located on an axis.

13. The switch device according to claim 12, wherein the switch device comprises a movable block in the shell, the movable block provides for the operating member to be disposed and is formed with a fitting groove against which one end of the spring abuts and a fitting opening providing for the movable conductor to be disposed.

14. The switch device according to claim 1, wherein the switch device comprises a movable block in the shell, the movable block provides for the operating member to be disposed and is formed with a fitting groove against which one end of the spring abuts and a fitting opening providing for the movable conductor to be disposed.

* * * * *